United States Patent
Häberlein et al.

(10) Patent No.: US 11,913,108 B2
(45) Date of Patent: Feb. 27, 2024

(54) METHOD AND DEVICE FOR HOMOGENEOUSLY COATING 3D SUBSTRATES

(71) Applicant: FHR ANLAGENBAU GMBH, Ottendorf-Okrilla (DE)

(72) Inventors: Sven Häberlein, Ottendorf-Okrilla (DE); Andreas Vogt, Dresden (DE); Roland Maudrich, Moritzburg (DE)

(73) Assignee: FHR ANLAGENBAU GMBH, Ottendorf-Okrilla (DE)

( * ) Notice: Subject to any disclaimer, the term of this patent is extended or adjusted under 35 U.S.C. 154(b) by 451 days.

(21) Appl. No.: 17/185,397

(22) Filed: Feb. 25, 2021

(65) Prior Publication Data
US 2021/0207260 A1    Jul. 8, 2021

Related U.S. Application Data

(62) Division of application No. 16/129,039, filed on Sep. 12, 2018, now abandoned.

(30) Foreign Application Priority Data

Sep. 14, 2017  (DE) .......................... 102017121327.9

(51) Int. Cl.
*C23C 14/34* (2006.01)
*C23C 14/54* (2006.01)
(Continued)

(52) U.S. Cl.
CPC ...... *C23C 14/3492* (2013.01); *C23C 14/3407* (2013.01); *C23C 14/50* (2013.01);
(Continued)

(58) Field of Classification Search
CPC . C23C 14/50; C23C 14/3407; C23C 14/3492; H01J 37/32403
See application file for complete search history.

(56) References Cited

U.S. PATENT DOCUMENTS

| 4,132,642 A | 1/1979 | Müller et al. |
| 4,313,815 A * | 2/1982 | Graves, Jr. ............. C23C 14/34 |
| | | 414/217 |

(Continued)

FOREIGN PATENT DOCUMENTS

| DE | 265175 A1 | 2/1989 |
| DE | 19537267 C1 | 10/1995 |

(Continued)

OTHER PUBLICATIONS

Webster's Ninth New Collegiate Dictionary; Merriam-Webster Inc., publishers; Springfield, Massachusetts, USA; 1990 (no month); excerpt p. 1254.

*Primary Examiner* — John J Brayton
(74) *Attorney, Agent, or Firm* — Heslin, Rothenberg Farley & Mesiti P.C.; Kevin P. Radigan, Esq.

(57) ABSTRACT

A method and a device are provided for homogeneously coating surfaces of 3D substrates in a vacuum chamber which has a sputtering source, such as a planar source or a tube or double-tube source, wherein individual substrates, with a curved substrate surface directed toward the sputtering source, are able to be moved past said source in a translational manner. The sputtering source is fastened to a chamber wall within a vacuum chamber so as to have two degrees of freedom such that the sputtering source is able to be set both in terms of its spacing to a surface to be coated of a substrate, which is moved past in front of said sputtering source in a translational manner, and with respect to the surface normal of the surface to be coated proceeding from a fixed point such that the surface normal deviation is 0° at all times.

9 Claims, 3 Drawing Sheets

(51) Int. Cl.
*C23C 14/56* (2006.01)
*H01J 37/34* (2006.01)
*H01J 37/32* (2006.01)
*C23C 14/50* (2006.01)

(52) U.S. Cl.
CPC ............ *C23C 14/54* (2013.01); *C23C 14/542* (2013.01); *C23C 14/56* (2013.01); *H01J 37/32403* (2013.01); *H01J 37/3417* (2013.01)

(56) References Cited

U.S. PATENT DOCUMENTS

| | | | |
|---|---|---|---|
| 4,426,267 A | | 1/1984 | Münz et al. |
| 4,790,921 A | * | 12/1988 | Bloomquist .......... C23C 14/505 |
| | | | 414/217 |
| 5,022,978 A | | 6/1991 | Hensel et al. |
| 2003/0136672 A1 | * | 7/2003 | Barrett ................ H01J 37/3435 |
| | | | 204/298.22 |
| 2015/0252468 A1 | | 9/2015 | Black et al. |
| 2016/0273092 A1 | * | 9/2016 | Hong ................... C23C 16/448 |

FOREIGN PATENT DOCUMENTS

| | | | | |
|---|---|---|---|---|
| DE | 4425991 C1 | 12/1995 | | |
| JP | S5511083 A | 1/1980 | | |
| JP | 59197570 A | * | 11/1984 | .......... H01J 37/3405 |
| JP | H11310875 A | 11/1999 | | |
| JP | 2016501314 A | 1/2016 | | |
| JP | 2017521560 A | 8/2017 | | |

\* cited by examiner

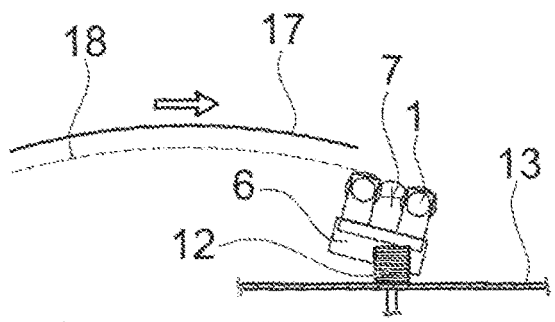
a)
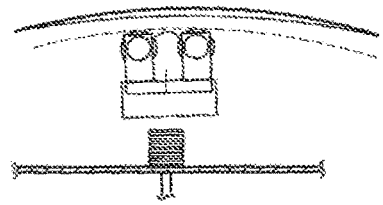
f)
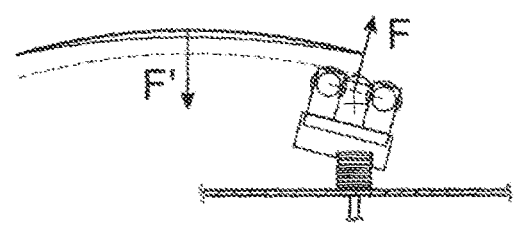
b)
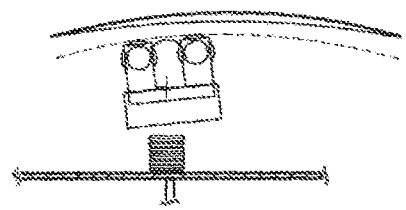
g)
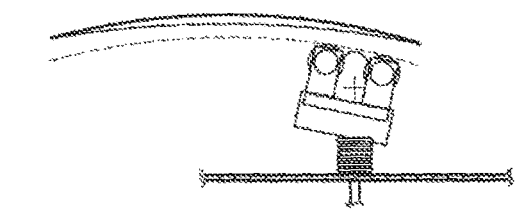
c)
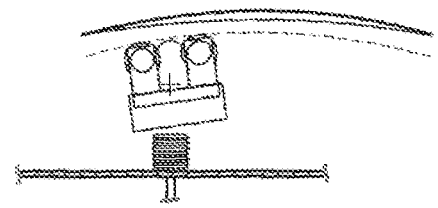
g)
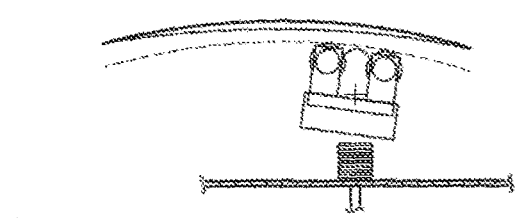
d)
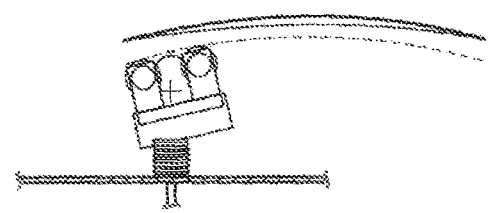
i)
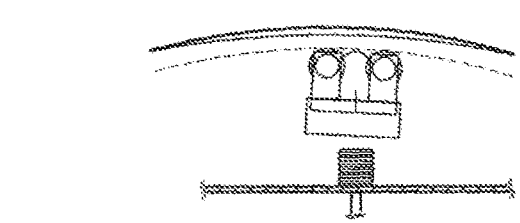
e)
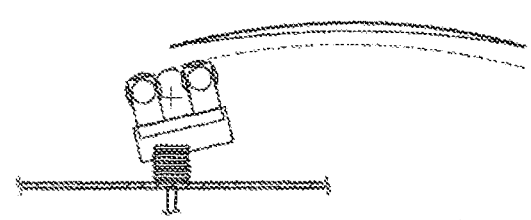
j)
Fig. 3a-j

METHOD AND DEVICE FOR HOMOGENEOUSLY COATING 3D SUBSTRATES

CROSS REFERENCE TO RELATED APPLICATIONS

This is a divisional application of U.S. patent application Ser. No. 16/129,039 filed Sep. 12, 2018 which claims priority to German provisional patent application number 10 2017 121 327.9 filed on Sep. 14, 2017. The contents of the prior applications are hereby incorporated by reference herein in their entirety.

BACKGROUND ART

The invention relates to a method and a device for homogeneously coating the surfaces of 3D substrates in a vacuum chamber which has a sputtering source, such as a planar source or a tube or double-tube source, wherein individual substrates, with a curved substrate surface directed toward the sputtering source, are able to be moved past said source in a translational manner.

Planar substrates are normally guided past fixedly installed sputtering sources in a vacuum chamber in a linear movement, in particular if these are very long, which can take place for example in the roll-to-roll method for substrates without transverse stability or via suitable guide devices for more stable substrates. It goes without saying that a homogeneous coating with a high layer quality of the layers applied to the substrate has to be ensured. This requires not only a uniform media supply of sputtering gases but also a spacing between the sputtering source and the substrate to be coated which is constant as far as possible and a constant speed of the substrate when the latter is being guided past the sputtering source.

As sputtering sources, use is made of so-called planar sources or tube or double-tube sources, which are provided with corresponding targets as particle sources and process gas supplies.

In the case of substrates having a surface to be coated which has greater or less curvature, such as 3D substrates which are individually guided past a fixedly installed sputtering source in a linear movement, the homogeneity of the coating deteriorates considerably. This is caused by the spacing between the sputtering source and the surface to be coated of the substrate, which surface is guided past said source, varying to a greater or lesser extent.

BRIEF SUMMARY OF THE INVENTION

The invention is therefore based on the object of providing a method and a device for homogeneously coating 3D substrates, by which homogeneous coating of the surface of individual 3D substrates, even having highly curved substrate surfaces, is ensured during a continuous translational movement past one or more sputtering sources in a vacuum chamber.

The object on which the invention is based is achieved in a method of the type mentioned in the introduction in that the spacing between the surface to be coated of the 3D substrate and an adaptable sputtering source and the inclination angle of the adaptable sputtering source to the 3D substrate are adapted steplessly during the linear passage of individual 3D substrates through the vacuum chamber such that the spacing between the surface to be coated of the 3D substrate to the adaptable sputtering source remains constant, and such that the surface normal of the adaptable sputtering source corresponds at all times to the current surface normal of the surface to be coated of the 3D substrate.

In one development of the method, the inclination angle of the adaptable sputtering source is able to be set in a predefined angle range.

The object on which the invention is based is furthermore achieved by a device in which the sputtering source is fastened to a chamber wall within a vacuum chamber so as to have two degrees of freedom such that the sputtering source is able to be set both in terms of its spacing to a surface to be coated of a 3D substrate, which is moved past in front of said sputtering source in a translational manner, and with respect to the current surface normal of the surface to be coated of the substrate proceeding from a fixed point such that the current surface normal deviation in relation to the surface normal of the sputtering source is 0° at all times.

In a first development of the invention, the sputtering source is fitted in a rotationally fixed manner on an end block and is connected by its free end to a counter-bearing which, via a counter-bearing receptacle, is supported on the end block, the latter being connected via a tube connection to one end of a doubly angled pivoting tube, the other end of which is coupled to a pivoting-tube drive.

Furthermore, the axis of symmetry of the pivoting-tube drive at the same time forms a virtual axis of rotation about which the pivoting tube is able to be pivoted, wherein the axis of rotation at the same time extends longitudinally through the sputtering source. In this way, an angle setting of the sputtering source about the axis of rotation is made possible.

In an advantageous refinement of the invention, the pivoting-tube drive is coupled via a vacuum rotary lead-through, in the form of a hollow shaft, to a pivoting-motor/gearing unit which is arranged at the front free end of a displacement tube.

In order to be able to fit the pivoting-motor/gearing unit outside the vacuum chamber, said unit is situated in an atmospheric box.

Furthermore, the displacement tube is fastened to the inner side of the chamber wall by way of a connection tube as a fixed point. Consequently, the movement path of the substrate is uniquely associated with the fixed point, with the result that exact positioning of the sputtering source with respect to a process curve extending directly in front of the substrate is possible.

The displacement tube and the connection tube are sealed off from the chamber atmosphere with the aid of a vacuum bellows. In order to ensure precise guidance, the displacement tube is guided, together with the pivoting-tube drive situated at its free end, on a displacement bearing and is coupled to a linear drive.

Preferably, the linear drive, in the form of a pneumatic or electric drive, is coupled to the displacement tube via a displacement drive rod.

Finally, the sputtering source may be a planar source or a tube or double-tube source.

The invention makes it possible to adapt the target-(sputtering source-) substrate spacing and the target (sputtering source) angle and substrate angle steplessly and fully automatically during the linear passage of individual 3D substrates through the vacuum chamber, with the result that a homogeneous coating, even with multiple layers, is achieved on the entire surface to be coated.

BRIEF DESCRIPTION OF THE DRAWINGS

The invention will be discussed in more detail below on the basis of an exemplary embodiment. In the associated figures of the drawing:

FIGS. 3a-j show different movement phases of the sputtering source while a 3D substrate is being transported past it.

According to the method according to the invention for homogeneously coating surfaces of 3D substrates 17 in a vacuum chamber (not illustrated), which has a sputtering source 1, such as a planar source or a tube or double-tube source, wherein the 3D substrates 17, with a curved substrate surface to be coated directed toward the sputtering source 1, are individually able to be moved past said source in a translational manner, the spacing between the surface to be coated of the 3D substrate 17 and an adaptable sputtering source 1 and the inclination angle of the adaptable sputtering source 1 to the 3D substrate 17 are adapted steplessly in a predefined angle range during the linear passage of individual 3D substrates 17 through the vacuum chamber such that the spacing between the surface to be coated of the 3D substrate 17 to the adaptable sputtering source 1 remains constant, and such that the surface normal of the adaptable sputtering source 1 corresponds at all times to the current surface normal of the surface to be coated of the 3D substrate 17.

Figure 1:
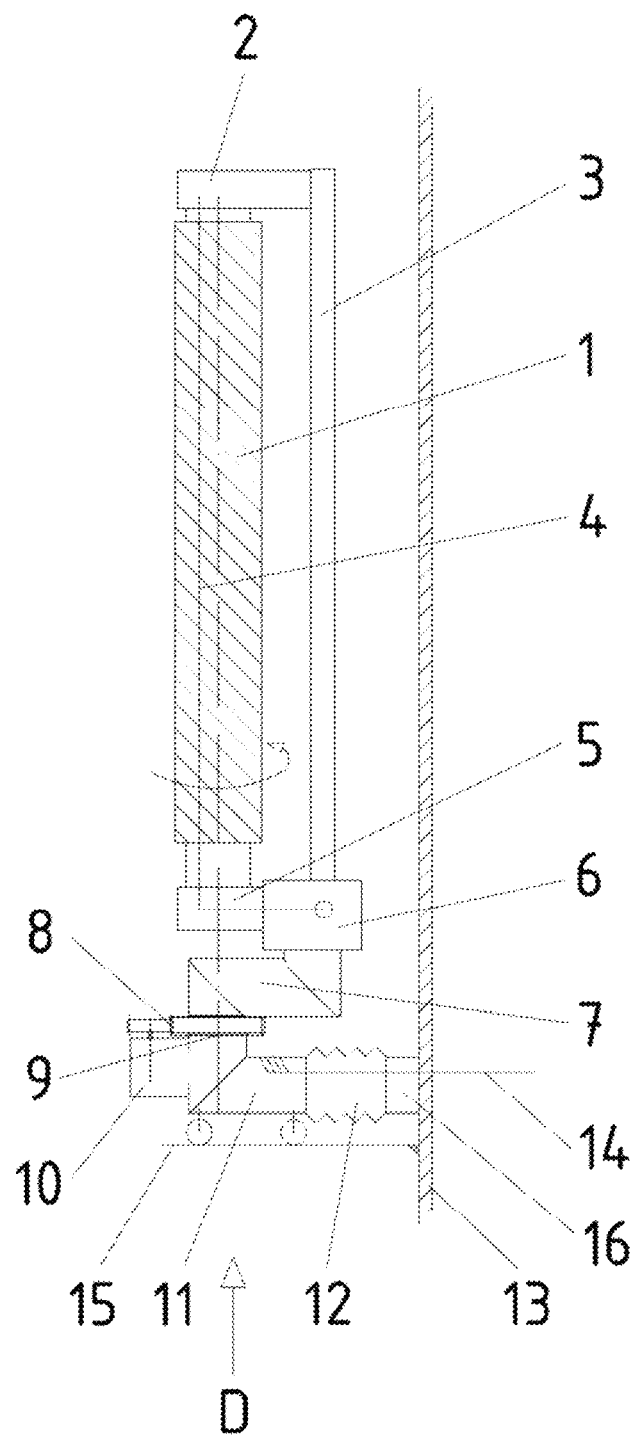
FIG. 1 shows a side view of a sputtering source according to the invention, which is fastened to the inner side of a chamber wall of a vacuum chamber.

FIG. 1 illustrates a device for carrying out the method for homogeneously coating surfaces of 3D substrates 17. According to this, an elongate sputtering source 1, for example a planar source, a tube source or a double-tube source, is fastened by one end to an end block 5 or to a source connection adapter and is connected by the other end to a counter-bearing 2 which, via a counter-bearing receptacle 3, is likewise supported on the end block 5. In this way, a sufficiently stable fastening of the sputtering source 1 is ensured. Furthermore, the source connection adapter 5 is connected to a gas distributor rail 4 which extends along the sputtering source 1. The gas distributor rail 4 is connected via the source connection adapter 5 to a corresponding source for sputtering gas.

In the case of a sputtering source 1 in the form of a double-tube source, as is schematically illustrated in FIG. 3, the gas distributor rail 4 is situated between the two tubes, or on the right and on the left next to the double-tube source, for the purpose of supplying the sputtering gas required for the respective sputtering task, such as krypton, argon, nitrogen, etc., into the sputtering region (FIG. 1).

The source connection adapter 5 is furthermore connected via a tube connection 6 and a vacuum seal to one end of a doubly angled pivoting tube 7, the other end of which is coupled to a pivoting-tube drive 8. Atmospheric pressure prevails in the interior of the pivoting tube 7. The pivoting-tube drive 8 is coupled via a vacuum rotary lead-through 9, in the form of a hollow shaft, to a pivoting-motor/gearing unit 10 which is arranged at the front free end of a displacement tube 11.

The axis of symmetry of the pivoting-tube drive at the same time forms the virtual axis of rotation D about which the pivoting tube 7 is able to be pivoted, and at the same time extends longitudinally through the sputtering source 1. In this way, pivoting of the pivoting tube 7 about the axis of rotation D at the same time brings about rotation of the sputtering source 1 about the same axis, albeit without at the same time changing the spatial position in relation to a 3D substrate 17 which is able to be moved past in front of the sputtering source 1 at a defined spacing.

A controlled linear positional change of the sputtering source 1 with respect to a process curve 18 which extends so as to be equidistant from the profile of the surface to be coated of the 3D substrate 17 can be brought about by longitudinal displacement of the displacement tube 11. For this purpose, the other end of the displacement tube 11 is fastened to the inner side of the chamber wall 13 of a vacuum chamber (not illustrated in more detail) by way of a connection tube 16 as a fixed point. The displacement tube 11 and the fixedly positioned connection tube 16 may, for example, penetrate longitudinally in a telescopic manner and, at the position of penetration, are sealed off from the chamber atmosphere with the aid of a vacuum bellows 12. This allows longitudinal displacement of the displacement tube 11 together with the vacuum rotary lead-through 9 at the free end of said tube in a manner guided by a displacement bearing arrangement 15, on the connection tube 16, for example with the aid of a displacement drive rod 14 or the like in conjunction with a pneumatic or electric drive (not illustrated).

This construction allows the sputtering source 1, the pivot axis of which is aligned with the axis of rotation D of the vacuum rotary lead-through 9, firstly to be steplessly pivoted about the axis of the vacuum rotary lead-through 9 in a predefined angle range in order to set a predefined inclination angle of ±0°-approx. 45°, and secondly to be continuously set at a spacing to the chamber wall 13, or to a 3D substrate 17 to be coated, while the latter is being transported past the sputtering source 1 in a linear movement (see arrow in FIG. 3a), as can be seen from FIG. 3. The exact angle range and also the maximum displacement of the displacement tube are directly dependent on the curvature of the surface to be coated of the 3D substrate 17.

Figure 2:
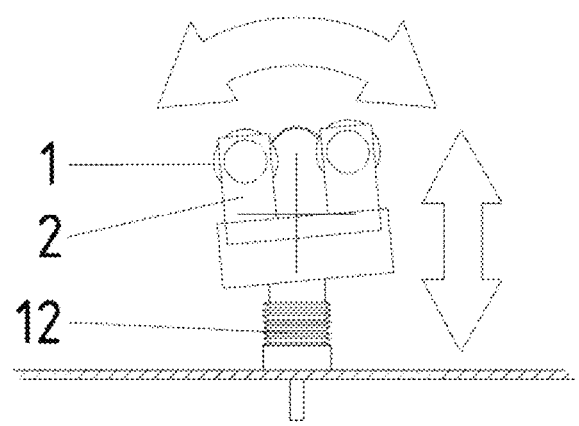
FIG. 2 shows an end view of a sputtering source with an illustration of the movement possibilities in relation to a 3D substrate which is able to be transported past the sputtering source in a rectilinear manner.

Said construction allows automatic simultaneous control of both movements of the sputtering source during the linear passage of the 3D substrate, as is correspondingly illustrated in FIG. 2.

FIGS. 3 a-j schematically show the different positions and pivot angles of the sputtering source 1 while the 3D substrate 17, with a concavely curved surface to be coated which is directed toward the sputtering source 1, is being moved past the sputtering source 1 in a linear movement from the left to the right (see arrow in FIG. 3a). FIG. 3a shows the position of the 3D substrate 17 prior to the start of the coating with the sputtering source 1 pivoted to the right, said source then, with the further linear movement of the 3D substrate to the right according to the diagram, continuously pivoting to the left and simultaneously being pushed forward toward the 3D substrate 17 (FIG. 3e) until the middle position, and subsequently performing an opposite linear movement, with the sputtering source 1 simultaneously being pivoted increasingly further to the left.

Thus, while the 3D substrate 17, with its curved side to be coated, is transported past the sputtering source (cf. FIGS. 3 a-j), it is possible by way of a controlled source movement by means of pivoting and displacement to orient the sputtering source 1 along a process curve 18 in front of the surface to be coated such that the surface normal F of the sputtering source 1 corresponds at all times to the current surface normal F' of the surface to be coated of the substrate 17. This requires continuous following-up of the angle setting and the spacing of the sputtering source 1 to the 3D substrate.

A surface normal is to be understood as a vector which is at all times orthogonal to a straight line, curve, plane or a curved surface. In the case of a sputtering source 1 in the form of a planar source, this is the surface of a planar target and, in the case of a tube source, this is the surface of the tubular target and, in the case of a double-tube source, this is the virtual surface between the individual tubes of the double-tube source.

For a uniform coating of the 3D substrate 17, it is essential both that the 3D substrate 17, or a sequence of 3D substrates 17, is moved past in front of the sputtering source 1 at a uniform speed using a suitable transport device, and that the sputtering source 1 follows the process curve 18.

As a result of the simultaneous displaceability and pivotability according to the invention of the sputtering source 1, it is ensured that, while the 3D substrate 17 is being moved past the sputtering source 1 in a linear movement, the sputtering source 1 can constantly be adapted steplessly, in terms of angle and spacing, to the geometry even of particularly large 3D substrates 17 or substrates 17 with large surfaces to be coated.

The control of the pivoting-tube drive 8 for setting the inclination angle of the sputtering source, and of the drive for axially displacing the displacement tube with the aid of the displacement drive rod 14 for the purpose of precisely setting the spacing of the sputtering source 1 to the surface to be coated of the substrate 17, can be realized by a positional control for the follow-up control along the process curve, or in a sensor-controlled manner, in that the spacing between the sputtering source 1 and the surface to be coated of the substrate 17 and the angular position of the sputtering source 1 with respect to the surface normal of the surface of the substrate 17 are measured, wherein the angular deviation in relation to the surface normal should be 0° at all times.

It is self-evident that, instead of the substrate 17 illustrated in FIG. 3, which has a concavely or convexly curved surface to be coated, it is also possible for other substrates with other surface shapes, such as a wave-like surface, to be coated equally well by way of the sputtering source 1 adaptable according to the invention.

Moreover, the adaptable sputtering source 1 can be situated in a vertical arrangement in front of a vertical chamber wall 13, as is illustrated in FIG. 1, wherein then the substrates 17 to be coated, with the surface to be coated in a vertical arrangement, are moved past in front of the sputtering source 1 at a defined spacing using a suitable transport device.

Equally, according to requirement, the sputtering source 1 may also be arranged in the vacuum chamber in another orientation, such as a horizontal orientation.

What is claimed is:

1. A device for homogeneously coating surfaces of 3D substrates in a vacuum chamber, the device comprising:
    an elongated sputtering source having one end and another end, the elongated sputtering source being fastened at the one end to a source connection adapter and at the other end to a counter-bearing, the counter-bearing being supported, via a counter-bearing receptable, by the source connection adapter;
    a tube connection connected to the source connection adapter;
    a doubly-angled pivoting tube, wherein the tube connection connects the source connection adapter to one end of the doubly-angled pivoting tube;
    a pivoting tube drive coupled to another end of the doubly-angled pivoting tube and forming a virtual axis of rotation D about which the doubly-angled pivoting tube is able to be pivoted, the virtual axis of rotation extending longitudinally through the elongated sputtering source;
    a pivoting-motor/gearing unit coupled to the pivoting tube drive;
    a displacement tube, the pivoting-motor/gearing unit being arranged at one end of the displacement tube, and another end of the displacement tube being coupled to an inner chamber wall of the vacuum chamber as a fixed point;
    wherein pivoting of the doubly-angled pivoting tube about the virtual axis of rotation D results in rotation of the sputtering source about the same axis of rotation, without causing a change in spatial position in relation to a 3D substrate, the 3D substrate being able to be moved past the elongated sputtering source in a translational manner at a defined spacing for coating of the 3D substrate, the 3D substrate having a curved substrate surface to be coated that is directed towards the elongated sputtering source; and
    wherein the elongated sputtering source can be steplessly pivoted in a predefined angle range to set a predefined inclination angle and to be continuously set in operation at a desired spacing to the inner chamber wall or a desired spacing to the 3D substrate to be coated.

2. The device as claimed in claim 1, wherein the axis of symmetry of the pivoting-tube drive at the same time forms the virtual axis of rotation (D) about which the pivoting tube is able to be pivoted, wherein the virtual axis of rotation (D) at the same time extends longitudinally through the sputtering source.

3. The device as claimed in claim 2, wherein the pivoting-tube drive is coupled via a vacuum rotary lead-through, in the form of a hollow shaft, to a pivoting-motor/gearing unit which is arranged at the front free end of a displacement tube.

4. The device claimed in claim 3, wherein the pivoting-motor/gearing unit is situated in an atmospheric box.

5. The device as claimed in claim 1, further comprising a connection tube, wherein the displacement tube is fastened to the inner chamber wall by way of the connection tube as the fixed point.

6. The device as claimed in claim 5, wherein the displacement tube and the connection tube are sealed off from the vacuum chamber atmosphere with the aid of a vacuum bellows.

7. The device as claimed in claim 1, wherein the displacement tube is guided, together with the pivoting-tube drive situated at a free end of the displacement tube, on a displacement bearing arrangement and is coupled to a linear drive.

8. The device as claimed in claim 7, wherein the linear drive comprises a pneumatic drive or an electric drive, and is coupled to the displacement tube via a displacement drive rod.

9. The device as claimed in claim 1, wherein the elongated sputtering source comprises a planar source, or a tube or double-tube source.

* * * * *